United States Patent
Kim

(10) Patent No.: US 10,074,707 B2
(45) Date of Patent: Sep. 11, 2018

(54) THIN FILM TRANSISTOR ARRAY FOR ORGANIC LIGHT-EMITTING DISPLAY

(71) Applicant: SAMSUNG DISPLAY CO., LTD., Yongin-si, Gyeonggi-do (KR)

(72) Inventor: Jeonghun Kim, Yongin-si (KR)

(73) Assignee: SAMSUNG DISPLAY CO. LTD., Gyeonggi-Do (KR)

( * ) Notice: Subject to any disclaimer, the term of this patent is extended or adjusted under 35 U.S.C. 154(b) by 13 days.

(21) Appl. No.: 15/153,767

(22) Filed: May 13, 2016

(65) Prior Publication Data
US 2017/0125500 A1    May 4, 2017

(30) Foreign Application Priority Data
Nov. 3, 2015  (KR) .................. 10-2015-0153803

(51) Int. Cl.
| | |
|---|---|
| *H01L 29/08* | (2006.01) |
| *H01L 21/00* | (2006.01) |
| *H01L 27/32* | (2006.01) |
| *H01L 27/12* | (2006.01) |
| *H01L 21/027* | (2006.01) |
| *H01L 21/3213* | (2006.01) |

(52) U.S. Cl.
CPC ...... *H01L 27/3262* (2013.01); *H01L 21/0274* (2013.01); *H01L 21/32139* (2013.01); *H01L 27/1255* (2013.01); *H01L 27/1259* (2013.01); *H01L 27/1288* (2013.01); *H01L 27/3248* (2013.01); *H01L 27/3258* (2013.01); *H01L 27/3265* (2013.01); *H01L 2227/323* (2013.01)

(58) Field of Classification Search
CPC ............ H01L 27/1259; H01L 27/3265; H01L 27/3262; H01L 21/0274; H01L 27/1255; H01L 27/1288; H01L 27/3248; H01L 27/3258
See application file for complete search history.

(56) References Cited

U.S. PATENT DOCUMENTS

| | | | |
|---|---|---|---|
| 2007/0000860 A1 | 1/2007 | Nam | |
| 2007/0202691 A1 | 8/2007 | Lee et al. | |
| 2013/0109175 A1 | 5/2013 | Zhang et al. | |
| 2014/0131677 A1* | 5/2014 | Oh ................... | H01L 51/5228 257/40 |

FOREIGN PATENT DOCUMENTS

| | | |
|---|---|---|
| KR | 1020030001085 A | 1/2003 |
| KR | 1020030092873 A | 12/2003 |
| KR | 1020050104088 A | 11/2005 |
| KR | 1020070002947 A | 1/2007 |
| KR | 1020070088244 A | 8/2007 |
| KR | 1020070098335 A | 10/2007 |

* cited by examiner

*Primary Examiner* — Alonzo Chambliss
(74) *Attorney, Agent, or Firm* — Cantor Colburn LLP

(57) ABSTRACT

A thin-film transistor array substrate includes a substrate; a first active layer of a first transistor, which is on the substrate and includes a source region, a channel region, and a drain region; a conductive layer, which is on the first active layer and is electrically connected to the source region or the drain region via a contact hole; a first insulating layer and a second insulating layer, which are between the first active layer and the conductive layer, where the contact hole is defined through the first and second insulating layers; and a first supporting layer, which is between the first insulating layer and the second insulating layer and surrounds at least a portion of the contact hole.

20 Claims, 14 Drawing Sheets

THIN FILM TRANSISTOR ARRAY FOR ORGANIC LIGHT-EMITTING DISPLAY

This application claims priority to Korean Patent Application No. 10-2015-0153803, filed on Nov. 3, 2015, and all the benefits accruing therefrom under 35 U.S.C. § 119, the content of which in its entirety is herein incorporated y by reference.

BACKGROUND

1. Field

One or more exemplary embodiments relate to a thin-film transistor array substrate, a method of manufacturing the thin film transistor array, and an organic light-emitting display apparatus including the thin-film transistor array substrate, and more particularly, to a thin-film transistor array substrate that includes fine contact holes for improving display quality, a method of manufacturing the thin film transistor array, and an organic light-emitting display apparatus including the thin-film transistor array substrate.

2. Description of the Related Art

A display apparatus, such as an organic light-emitting display apparatus and a liquid crystal display apparatus, typically includes a thin-film transistor ("TFT"), a capacitor, and a plurality of wires. A substrate, on which a display apparatus is fabricated, includes a fine pattern including TFTs, capacitors, and wires, where the display apparatus is operated based on complicated connections between the TFTs, the capacitors, and the wires.

Recently, as a demand for compact and high resolution display apparatuses increases, demands for efficient space arrangements and connection structures between TFTs, capacitors and wires arranged in display apparatuses are increasing.

An organic light-emitting display apparatus typically includes an organic emission element, which includes a hole injection electrode, an electron injection electrode, and an organic emission layer therebetween, and is a self-luminescent display apparatus that emits light as excitons, which are generated as holes injected by the hole injection electrode combine with electrons injected by the injection electrode in the organic emission layer, are switched from an excited state to a ground state.

Since an organic light-emitting display apparatus, which is a self-luminescent display apparatus, may not include a separate light source, the organic light-emitting display apparatus may be driven with a low voltage, may be a thin and lightweight display apparatus, and has a wide viewing angle, high contrast, and fast response speed, and thus organic light-emitting display apparatuses are widely used in electronic devices from personal portable devices, such as MP3 players and mobile phones, to televisions ("TV"s).

SUMMARY

To embody a compact and high resolution organic light-emitting display apparatus, it is desired to reduce the sizes of elements included in the organic light-emitting display apparatus and increase the number of elements. As the number of elements included in an organic light-emitting display apparatus increases to realize high resolution, the number of contact holes formed in a substrate of the organic light-emitting display apparatus increases. However, it is not easy to form a plurality of contact holes having a fine and uniform size in a substrate.

One or more exemplary embodiments include a thin-film transistor array substrate with improved display quality by forming fine contact holes without damaging insulating layers, a method of manufacturing the thin-film transistor array substrate, and an organic light-emitting display apparatus including the thin-film transistor array substrate.

According to one or more exemplary embodiments, a thin-film transistor array substrate includes a substrate; a first active layer of a first transistor, which on over the substrate and includes a source region, a channel region, and a drain region; a conductive layer, which is on the first active layer and is electrically connected to the source region or the drain region via a contact hole; a first insulating layer and a second insulating layer, which are between the first active layer and the conductive layer, where the contact hole is defined through the first and second insulating layers; and a first supporting layer, which is between the first insulating layer and the second insulating layer and surrounds at least a portion of the contact hole.

In an exemplary embodiment, the first supporting layer may include a metal.

In an exemplary embodiment, the thin-film transistor array substrate may further include a first gate electrode of the first transistor, which is between the first insulating layer and the second insulating layer and overlaps the channel region in a plan view, where the first supporting layer may include a same material as the first gate electrode.

In an exemplary embodiment, the thin-film transistor array substrate may further include a third insulating layer, which is between the first active layer and the first insulating layer, where the contact hole is defined through the third insulating layer; a second transistor, which is electrically connected to the first transistor; and a capacitor, which overlaps the second transistor in a plan view. In such an embodiment, the second transistor may include a second active layer in the same layer as the first active layer and a second gate electrode on the third insulating layer to overlap at least a portion of the second active layer, and the capacitor may include a first electrode defined by the second gate electrode and a second electrode which faces the second gate electrode.

In an exemplary embodiment, the first supporting layer may be in the same layer as the second electrode and may include a same material as the second electrode.

In an exemplary embodiment, the thin-film transistor array substrate may further include a second supporting layer, which is between the third insulating layer and the first insulating layer and surrounds at least a portion of the contact hole.

In an exemplary embodiment, the thin-film transistor array substrate may further include a mask pattern, which is between the second insulating layer and the conductive layer and surrounds at least a portion of the contact hole, where the mask pattern may directly contact the conductive layer.

In an exemplary embodiment, the mask pattern may include a metal.

According to one or more exemplary embodiments, a method of manufacturing a thin-film transistor array substrate includes providing a first active layer of a first transistor, which includes a source region, a channel region, and a drain region, on a substrate; providing a first insulating layer, which covers the first active layer, on the substrate; providing a first supporting layer, which overlaps at least a portion of the first active layer in a plan view and includes a metal, on the first insulating layer; providing a second insulating layer on the first insulating layer to cover the first supporting layer; forming a contact hole, which at least partially contacts the first supporting layer, by etching the first insulating layer and the second insulating layer to expose at least a portion of the source region or the drain region; and providing a conductive layer, which is connected to the source region or the drain region via the contact hole, on the second insulating layer.

In an exemplary embodiment, the method may further include, after the providing the first insulating layer, providing a first gate electrode, which overlaps the channel region in a plan view and is apart from the first supporting layer, on the first insulating layer, where the providing the first gate electrode and the providing the supporting layer may be performed during a same mask process.

In an exemplary embodiment, the method may further include providing a second transistor electrically connected to the first transistor and a capacitor overlapping the second transistor in a plan view, where the providing the second transistor and the capacitor may include, before the providing first insulating layer, providing a second active layer of the second transistor in the same layer as the first active layer; providing a third insulating layer on the substrate to cover the first active layer and the second active layer; providing a second gate electrode, which overlaps at least a portion of the second active layer, on the third insulating layer; and, after the providing the first insulating layer, providing a second electrode of the capacitor to face the second gate electrode, which functions as a first electrode of the capacitor, on the first insulating layer.

In an exemplary embodiment, the providing the second electrode and the providing the first supporting layer may be performed during a same mask process.

In an exemplary embodiment, the method may further include, before the providing the conductive layer, providing a mask pattern, which contacts the conductive layer, on the second insulating layer, where the providing the mask pattern may include providing a metal layer to cover an entire top surface of the second insulating layer; providing a photoresist on the metal layer; irradiating light onto the photoresist by using a half-tone mask including a light-transmitting portion that transmits the light therethrough, a partial-transmitting portion that partially transmits the light therethrough, and a light-blocking portion that blocks the light; providing a photoresist pattern including a first region corresponding to the light-blocking portion, a second region, which corresponds to the partial-transmitting portion and has a height lower than a height of the first region, and an opening corresponding to the light-transmitting portion, by removing a light-irradiated portion of the photoresist; forming the contact hole by removing portions of the metal layer exposed by the opening of the photoresist pattern and portions of the first insulating layer and the second insulating layer corresponding to the portions of the metal layer exposed by the opening of the photoresist pattern; removing the entire portion of the photoresist pattern corresponding to the partial-transmitting portion and a portion of the photoresist pattern corresponding to the light-blocking portion by an ashing process; and forming the mask pattern by removing portions of the metal layer exposed by the partially-removed photoresist pattern.

According to one or more exemplary embodiments, an organic light-emitting display apparatus includes a substrate; a first active layer of a first transistor, which is on the substrate and includes a source region, a channel region, and a drain region; a conductive layer, which is above the first active layer and is electrically connected to the source region or the drain region via a contact hole; a first insulating layer and a second insulating layer, which are between the first active layer and the conductive layer, where the contact hole is defined through the first and second insulating layers; a first supporting layer, which is between the first insulating layer and the second insulating layer and surrounds at least a portion of the contact hole; a via insulating layer, which covers the first transistor; a first electrode, which is on the via insulating layer; a second electrode, which faces the first electrode; and an organic emission layer, which is between the first electrode and the second electrode.

In an exemplary embodiment, the first supporting layer may include a metal.

The organic light-emitting display apparatus may further include a first gate electrode of the first transistor, which is between the first insulating layer and the second insulating layer and overlaps the channel region in a plan view, where the first supporting layer may include a same material as the first gate electrode.

In an exemplary embodiment, the organic light-emitting display apparatus may further include a third insulating layer, which is between the first active layer and the first insulating layer, where the contact hole is defined through the third insulating layer; a second transistor, which is electrically connected to the first transistor; and a capacitor, which overlaps the second transistor in a plan view. In such an embodiment, the second transistor may include a second active layer in a same layer as the first active layer and a second gate electrode on the third insulating layer to overlap at least a portion of the second active layer, and the capacitor may include a first electrode defined by the second gate electrode and a second electrode which faces the second gate electrode.

In an exemplary embodiment, the first supporting layer may be in the same layer as the second electrode and may include a same material as the second electrode.

In an exemplary embodiment, the organic light-emitting display apparatus may further include a second supporting layer, which is between the third insulating layer and the first insulating layer and surrounds at least a portion of the contact hole.

In an exemplary embodiment, the organic light-emitting display apparatus may further include a mask pattern, which is between the second insulating layer and the conductive layer and surrounds at least a portion of the contact hole, where the mask pattern may directly contact the conductive layer and includes a metal.

BRIEF DESCRIPTION OF THE DRAWINGS

These and/or other features of exemplary embodiments of the invention will become apparent and more readily appreciated from the following description of the exemplary embodiments, taken in conjunction with the accompanying drawings, in which.

DETAILED DESCRIPTION

Figure 1:
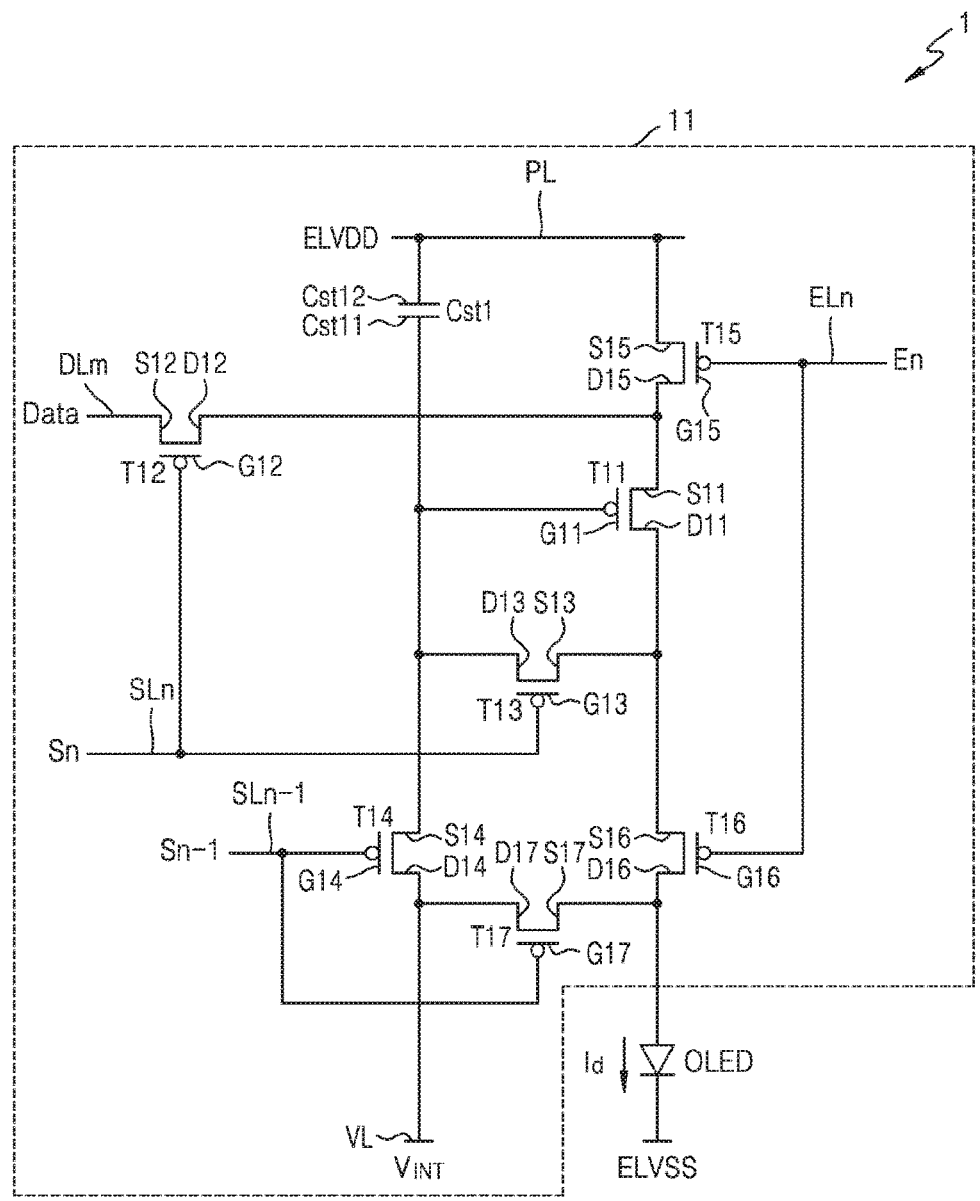
FIG. 1 is an equivalent circuit diagram showing a pixel of an organic light-emitting display apparatus according to an embodiment.

Reference will now be made in detail to exemplary embodiments, examples of which are illustrated in the accompanying drawings, where like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. "Or" means "and/or." As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another. As used herein, the singular forms "a," "an" and "the" are intended to include the plural forms as well, unless the context clearly indicates otherwise.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Throughout the specification, it will be understood that when a portion is referred to as being "connected to" another portion, it can be "directly connected to" the other portion or "electrically connected to" the other portion via another element. Furthermore, Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Sizes of elements in the drawings may be exaggerated for convenience of explanation. In other words, since sizes and thicknesses of components in the drawings are arbitrarily illustrated for convenience of explanation, the following embodiments are not limited thereto.

Furthermore, although an active matrix ("AM")-type organic light-emitting display apparatus having a 7Tr-1Cap structure, in which a single pixel includes 7 thin-film transistors ("TFT"s) and 1 capacitor, and an AM-type organic light-emitting display apparatus having a 2Tr-1 Cap structure, in which a single pixel includes 2 TFTs and 1 capacitor, are shown in the attached drawings for convenience of illustration, the inventive concept is not limited thereto. Therefore, in an organic light-emitting display apparatus, a single pixel may include a plurality of TFTs and one or more capacitors, where various structures may be configured by forming an additional wire or omitting existing wires. A pixel refers to the smallest unit for displaying an image, and an organic light-emitting display apparatus displays an image via a plurality of pixels.

Hereinafter, exemplary embodiments of the inventive concept will be described in detail with reference to the accompanying drawings.

FIG. 1 is an equivalent circuit diagram showing a pixel of an organic light-emitting display apparatus 1 according to an embodiment.

Referring to FIG. 1, an embodiment of the organic light-emitting display apparatus 1 includes a thin-film transistor array substrate 11 and an organic light-emitting device ("OLED") on the thin-film transistor array substrate 11. The organic light-emitting display apparatus 1 may include a plurality of pixels, where the OLED is arranged at each of the plurality of pixels. The thin-film transistor array substrate 11 includes pixel circuits for driving the respective pixels and a plurality of wires for applying electric signals to the pixel circuits.

The wires may include scan lines SLn and SLn−1 for transmitting scan signals Sn and Sn−1, a data line DLm for transmitting a data signal Data therethrough, and a driving voltage line PL for transmitting a driving voltage ELVDD to the pixel circuit. However, the inventive concept is not limited thereto and, as shown in FIG. 1, the wires may further include an initializing voltage line VL for transmitting an initializing voltage $V_{INT}$ to the thin-film transistor array substrate 11 and an emission control line ELn for transmitting an emission control signal En to the thin-film transistor array substrate 11. In one embodiment, for example, the plurality of pixels may be arranged at points where a plurality of wires extending in a first direction intersects a plurality of wires extending in a second direction, respectively.

Each pixel includes an OLED that emits light and a pixel circuit that receives signals from wires and drives the OLED based on the signals. A pixel circuit may include a transistor, e.g., at least two transistors, and a capacitor, e.g., at least one capacitor. However, the inventive concept is not limited thereto, and as shown in FIG. 1, a pixel circuit may include seven transistors T11 through T17 and one capacitor Cst1.

Figure 2:
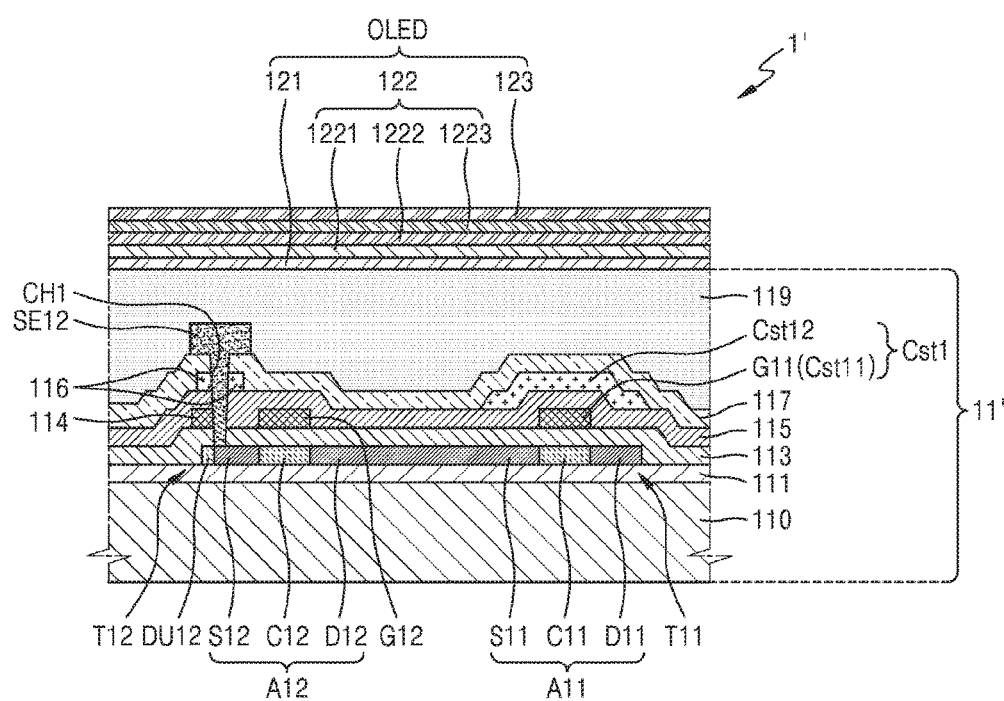
FIG. 2 is a schematic sectional view of an organic light-emitting display apparatus according to an embodiment.

In an embodiment, as shown in FIG. 2, the transistors T11 through T17 may include a driving transistor T11, a switching transistor T12, a compensating transistor T13, a first initializing transistor T14, a first emission control transistor T15, a second emission control transistor T16, and a second initializing transistor T17.

In such an embodiment, the driving transistor T11 includes a driving gate electrode G11, a driving source electrode S11, and a driving drain electrode D11. The driving gate electrode G11 is connected to a first electrode Cst11 of the capacitor Cst1, the driving source electrode S11 is connected to the driving voltage line PL via the first emission control transistor T15, and the driving drain electrode D11 is electrically connected to a first electrode of the OLED via the second emission control transistor T16. The driving transistor T11 receives a data signal Data during a data transmitting operation of the switching transistor T12, e.g., during a period in which the switching transistor T12 is turned on, and supplies a driving current $I_d$ to the OLED.

The switching transistor T12 includes a switching gate electrode G12, a switching source electrode S12, and a switching drain electrode D12. The switching gate electrode G12 is connected to the scan line SLn, the switching source electrode S12 is connected to the data line DLm, and the switching drain electrode D12 is connected to the driving source electrode S11 and is connected to the driving voltage line PL via the first emission control transistor T15. The switching transistor T12 is turned on in response to a scan signal Sn transmitted via the scan line SLn and performs a data transmitting operation for transmitting a data signal Data transmitted via the data line DLm to the driving source electrode S11.

The compensating transistor T13 includes a compensating gate electrode G13, a compensating source electrode S13, and a compensating drain electrode D13. The compensating gate electrode G13 is connected to the scan line SLn, and the compensating source electrode S13 is connected to the driving drain electrode D11 and is connected to the first electrode of the OLED via the second emission control transistor T16. The compensating drain electrode D13 is connected to the first electrode Cst11 of the capacitor Cst1, a first initializing source electrode S14 of the first initializing transistor T14, and the driving gate electrode G11. When the compensating transistor T13 is turned on in response to a scan signal Sn transmitted via the scan line SLn, the compensating transistor T13 connects the driving gate electrode G11 and the driving drain electrode D11 to each other, thereby diode-connecting the driving transistor T11.

The first initializing transistor T14 includes a first initializing gate electrode G14, a first initializing drain electrode D14, and the first initializing source electrode S14. The first initializing gate electrode G14 is connected to a previous scan line SLn-1, and the first initializing drain electrode D14 is connected to the initializing voltage line VL. The first initializing source electrode S14 is connected to the first electrode Cst11 of the capacitor Cst1, the compensating drain electrode D13 and the driving gate electrode G11. The first initializing transistor T14 is turned on in response to a previous scan signal Sn-1 received via the previous scan line SLn-1 and performs an initialization operation for resetting the voltage of the driving gate electrode G11 by transmitting an initializing voltage $V_{INT}$ to the driving gate electrode G11.

The first emission control transistor T15 includes a first emission control gate electrode G15, a first emission control source electrode S15, and a first emission control drain electrode D15. The first emission control gate electrode G15 is connected to the emission control line ELn. The first emission control source electrode S15 is connected to the driving voltage line PL, and the first emission control drain electrode D15 is connected to the driving source electrode S11 and the switching drain electrode D12. The first emission control transistor T15 is connected between the driving voltage line PL and the driving transistor T11. The first emission control transistor T15 is turned on in response to an emission control signal En transmitted via the emission control line ELn and transmits a driving voltage ELVDD to the driving transistor T11.

The second emission control transistor T16 includes a second emission control gate electrode G16, a first emission control source electrode S16, and a second emission control drain electrode D16. The second emission control gate electrode G16 is connected to the emission control line ELn, and the second emission control source electrode S16 is connected to the driving drain electrode D11 and the compensating source electrode S13. The second emission control drain electrode D16 is electrically connected to the first electrode of the OLED. The first emission control transistor T15 and the second emission control transistor T16 are simultaneously turned on in response to an emission control signal En transmitted via the emission control line ELn, a driving voltage ELVDD is transmitted to the OLED, and a driving current $I_d$ flows in the OLED.

The second initializing transistor T17 includes a second initializing gate electrode G17, a second initializing source electrode S17, and a second initializing drain electrode D17. The second initializing gate electrode G17 is connected to the previous scan line SLn-1. The second initializing source electrode S17 is connected to the first electrode of the OLED. The second initializing drain electrode D17 is connected to the initializing voltage line VL. The second initializing transistor T17 is turned on in response to a previous scan signal Sn-1 transmitted via the previous scan line SLn-1 and initializes the first electrode of the OLED.

An embodiment, where the first initializing transistor T14 and the second initializing transistor T17 are connected to the previous scan line SLn-1, is described above with reference to FIG. 1, embodiments are not limited thereto. According to an alternative embodiment, the first initializing transistor T14 may be connected to the previous scan line SLn-1 and be driven in response to a previous scan signal Sn-1, and the second initializing transistor T17 may be connected to another scan line (not shown) and be driven in response to another scan signal (not shown) transmitted through the another scan line.

In an embodiment, as shown in FIG. 1, a second electrode Cst12 of the capacitor Cst1 is connected to the driving voltage line PL, and a second electrode of the OLED is connected to a line of a common voltage ELVSS. Therefore, the OLED receives a driving current $I_d$ from the driving transistor T11 and emits light, thereby displaying an image.

FIG. 2 is a schematic sectional view of an organic light-emitting display apparatus according to an embodiment.

Referring to FIG. 2, an embodiment of an organic light-emitting display apparatus 1' includes a thin-film transistor array substrate 11' and an OLED on the thin-film transistor array substrate 11'. The thin-film transistor array substrate 11' includes a substrate 110, and a switching active layer A12 of the switching transistor T12, which is on the substrate 110. The switching active layer A12 includes a switching source region S12, a switching channel region C12 and a switching drain region D12. The thin-film transistor array substrate 11' further includes a conductive layer SE12, which is on the switching active layer A12 and is electrically connected to the switching source region S12 or the switching drain region D12 via a contact hole CH1. The thin-film transistor array substrate 11' further includes a top gate insulating layer 115 and an interlayer insulating layer 117, which are between the switching active layer A12 and the conductive layer SE12 and through which the contact hole CH1 is defined, and a second supporting layer 116, which is between the top gate insulating layer 115 and the interlayer insulating layer 117 and surrounds at least a portion of the contact hole CH1.

The substrate 110 may include one of various materials including glass, a metal, and plastic materials (e.g., polyethylene terephthalate ("PET"), polyethylene naphthalate ("PEN"), polyimide, etc.).

In an embodiment, the thin-film transistor array substrate 11' may further include a buffer layer 111 disposed on the substrate 110. The buffer layer 111 effectively prevents introduction of impurity atoms and planarizes a surface of the substrate 110. The buffer layer 111 may include at least one of silicon oxide ($SiO_2$) and silicon nitride ($SiN_x$). According to an alternative embodiment, the buffer layer 111 may include a single silicon oxide ($SiO_2$) layer, a single silicon nitride ($SiN_x$) layer, or a double layer including a stack of a silicon oxide ($SiO_2$) layer and a silicon nitride ($SiN_x$) layer.

In such an embodiment, the driving transistor T11 and the switching transistor T12 are disposed on the buffer layer 111. The driving transistor T11 and the switching transistor T12 include a driving active layer A11 and the switching active layer A12, respectively. The driving active layer A11 and the switching active layer A12 may be disposed in a same layer or directly on a same layer, e.g., the buffer layer 111. Herein, the switching transistor T12, the switching active layer A12, the driving transistor T11 and the driving active layer A11 of FIG. 2 may be referred to as a first transistor, a first active layer, a second transistor and a second active layer, respectively, but are not limited thereto.

The driving active layer A11 may include a driving source region S11 and a driving drain region D11, which are conductive by being doped with impurities and spaced apart from each other, and a driving channel region C11, which is between the driving source region S11 and the driving drain region D11 and includes a semiconductor material. The switching active layer A12 may include the switching source region S12 and the switching drain region D12, which are conductive by being doped with impurities and spaced apart from each other, and the switching channel region C12, which is between the switching source region S12 and the switching drain region D12 and includes a semiconductor material. The driving transistor T11 and the switching transistor T12 may be electrically connected to each other. In one embodiment, for example, the switching source region S12 and the switching drain region D12 may be a same region. Herein, the switching source region S12, the switching channel region C12 and the switching drain region D12 of FIG. 2 may be referred to as a source region, a channel region, and a drain region, respectively, but are not limited thereto.

The switching transistor T12 may further include a dummy active layer DU12. The dummy active layer DU12 may be close to the switching source region S12 and may include a same material as the switching channel region C12, that is, a semiconductor material.

In an embodiment, the thin-film transistor array substrate 11' may further include a bottom gate insulating layer 113 disposed on the buffer layer 111. In such an embodiment, the bottom gate insulating layer 113 covers the driving active layer A11, the switching active layer A12, and the dummy active layer DU12 is. In such an embodiment, the driving gate electrode G11 overlapping at least a portion of the driving active layer A11, the switching gate electrode G12 overlapping at least a portion of the switching active layer A12, and a first supporting layer 114 overlapping at least a portion of the dummy active layer DU12 may be disposed on the bottom gate insulating layer 113. Herein, the bottom gate insulating layer 113, the driving gate electrode G11 and the first supporting layer 114 of FIG. 2 may be referred to as a third insulating layer, a second gate electrode, and a second supporting layer, respectively.

The bottom gate insulating layer 113 may be disposed between the driving active layer A11, the switching active layer A12 and the dummy active layer DU12, and the top gate insulating layer 115 and may the contact hole CH1 is defined or formed therethrough. The bottom gate insulating layer 113 may be a single layer thin-film or a multilayered thin-film including an inorganic material or an organic material. In an embodiment, where the bottom gate insulating layer 113 is the single layer thin-film, the single layer thin-film may include silicon oxide ($SiO_2$) or silicon nitride ($SiN_x$).

Although not shown, the bottom gate insulating layer 113 may include a multilayered thin-film. According to such an embodiment, the bottom gate insulating layer 113 may include a bottom thin-film include silicon oxide ($SiO_2$) and a top thin-film including silicon nitride ($SiN_x$). In such an embodiment, when silicon nitride ($SiN_x$), which is more etchant-resistant than silicon oxide ($SiO_2$), is disposed on silicon oxide ($SiO_2$), damages to the bottom gate insulating layer 113 may be reduced during a patterning process of a gate electrode.

The driving gate electrode G11 may define or function as the first electrode (or a bottom electrode) Cst11 of the capacitor Cst1 described above with reference to FIG. 1.

The switching gate electrode G12 is disposed between the bottom gate insulating layer 113 and the top gate insulating layer 115 and may overlap the switching channel region C12 in a plan view or when view from a top plan view in a thickness direct of the thin-film transistor array substrate 11'.

The first supporting layer 114 may be disposed between the bottom gate insulating layer 113 and the top gate insulating layer 115, and surround at least a portion of the contact hole CH1.

The driving gate electrode G11, the switching gate electrode G12, and the first supporting layer 114 may include a same material as each other. Each of the driving gate electrode G11, the switching gate electrode G12, and the first supporting layer 114 may include a single layer or multiple layers including at least one metal selected from aluminum (Al), silver (Ag), tungsten (W), copper (Cu), nickel (Ni), chromium (Cr), molybdenum (Mo), titanium (Ti), platinum (Pt), tantalum (Ta), neodymium (Nd), scandium (Sc), a zinc oxide ($ZnO_x$), indium titanium oxide ("ITO"), a tin oxide ($SnO_x$), an indium oxide ($InO_x$), a gallium oxide ($GaO_x$), and indium zinc oxide ("IZO").

The top gate insulating layer 115 that covers the driving gate electrode G11, the switching gate electrode G12 and the first supporting layer 114 may be disposed on the bottom gate insulating layer 113. Herein, the top gate insulating layer 115 of FIG. 2 may be referred to as a first insulating layer. The top gate insulating layer 115 may include silicon oxide ($SiO_2$) or silicon nitride ($SiN_x$).

In an embodiment, the second supporting layer 116 and the second electrode (or a top electrode) Cst12 of the capacitor Cst1 may be disposed on the top gate insulating layer 115. In such an embodiment, the second supporting layer 116 and the second electrode Cst12 of the capacitor Cst1 may be disposed in a same layer and include a same material as each other. A first supporting layer in the claims may be the second supporting layer 116 of FIG. 2.

The second supporting layer 116 and the second electrode Cst12 of the capacitor Cst1 may be defined by a same metal layer. In one embodiment, for example, the second supporting layer 116 and the second electrode Cst12 of the capacitor Cst1 may include at least one selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The contact hole CH1 may be defined or formed through the second supporting layer 116, such that the second supporting layer 116 may surround at least a portion of the contact hole CH1.

The capacitor Cst1 may be disposed to overlap the driving transistor T11 in a plan view or when viewed from a top plan view. In such an embodiment, the capacitor Cst1 may include the driving gate electrode G11, which defines or functions as the first electrode Cst11 of the capacitor Cst1 described above with reference to FIG. 1, and the second electrode Cst12 of the capacitor Cst1, which faces the driving gate electrode G11 across the top gate insulating layer 115. The larger the first electrode Cst11 and the second electrode Cst12 constituting the capacitor Cst1 are, the higher the capacity of the Cst1 is.

The interlayer insulating layer 117 that covers the second supporting layer 116 and the second electrode Cst12 of the capacitor Cst1 may be disposed on the top gate insulating layer 115. Herein, the interlayer insulating layer 117 of FIG. 2 may be referred to as a second insulating layer. The interlayer insulating layer 117 may include silicon oxide (SiO$_2$) or silicon nitride (SiN$_x$).

In such an embodiment, the contact hole CH1 that exposes the switching source region S12 is defined in or through the bottom gate insulating layer 113, the top gate insulating layer 115 and the interlayer insulating layer 117. According to an embodiment, when the bottom gate insulating layer 113, the top gate insulating layer 115 and the interlayer insulating layer 117 are etched to form the contact hole CH1, the first supporting layer 114 and the second supporting layer 116 protect the top gate insulating layer 115 and the lower portion of the interlayer insulating layer 117, and thus the top gate insulating layer 115 and the interlayer insulating layer 117 may be effectively prevented from being damaged. Therefore, in such an embodiment, the finer contact hole CH1 may be effectively defined through the bottom gate insulating layer 113, the top gate insulating layer 115 and the interlayer insulating layer 117.

The conductive layer SE12 of the switching transistor T12 may be disposed on the interlayer insulating layer 117. The conductive layer SE12 may be connected to the switching source region S12 via the contact hole CH1 and may be electrically connected to the data line DLm describe above with reference to FIG. 1. In such an embodiment, the switching source region S12 may be electrically connected to the data line DLm via the conductive layer SE12. According to an embodiment, the conductive layer SE12 may be defined by a part of the data line DLm extending therefrom.

In an embodiment, the thin-film transistor array substrate 11' may further include a via insulating layer 119, which is disposed on the interlayer insulating layer 117 and covers the driving transistor T11 and the switching transistor T12, and a first electrode 121 of the OLED disposed on the via insulating layer 119.

The via insulating layer 119 may include or be formed of an organic insulation material, such as an acrylic organic material, polyimide, or benzocyclobutene ("BCB"). The via insulating layer 119 may protect elements (e.g., transistors) arranged therebelow and planarizes the top surface of the thin-film transistor array substrate 11'.

The first electrode 121 may include or formed of a material with a high work function and may include at least one of a reflective metal or a transparent conductive material. In one embodiment, for example, the first electrode 121 may contain at least one material selected from ITO, IZO, zinc oxide (ZnO), indium oxide (In$_2$O$_3$), indium gallium oxide ("IGO"), aluminum zinc oxide ("AZO"), silver (Ag), magnesium (Mg), aluminum (Al), platinum (Pt), palladium (Pd), gold (Au), nickel (Ni), neodymium (Nd), iridium (Ir), and chromium (Cr).

Although not shown, the thin-film transistor array substrate 11' may further include a pixel defining layer (not shown) which is disposed on the via insulating layer 119 and defines respective pixels. The pixel defining layer (not shown) includes an opening (not shown) that exposes the top surface of the first electrode 121 and may cover the surroundings of the first electrode 121.

In an embodiment, an intermediate layer 122 including an organic emission layer 1222 may be disposed on the first electrode 121 exposed by the pixel defining layer (not shown). The intermediate layer 122 may include the organic emission layer 1222, a bottom common layer 1221 arranged between the first electrode 121 and the organic emission layer 1222, and a top common layer 1223 arranged between the organic emission layer 1222 and a second electrode 123. In such an embodiment, the organic emission layer 1222 may be disposed between the first electrode 121 and the second electrode 123.

The second electrode 123 facing the first electrode 121 may be disposed over the pixel defining layer (not shown) and the intermediate layer 122. The OLED may include the first electrode 121, the intermediate layer 122, and the second electrode 123.

Although not shown, an encapsulating substrate (not shown) or an encapsulating layer (not shown) may be disposed over the second electrode 123.

According to an embodiment of the organic light-emitting display apparatus 1', fine contact holes are defined for large integration, and an insulating layer, through which the fine contact holes are defined, is effectively prevented from being significantly damaged to reduce the risk of a short-circuit. Accordingly, in such an embodiment, display quality may be substantially improved.

Hereinafter, alternative embodiments of the organic light-emitting display apparatus will be described. Any repetitive detailed description of the same or like elements will hereinafter be omitted or simplified.

Figure 3:
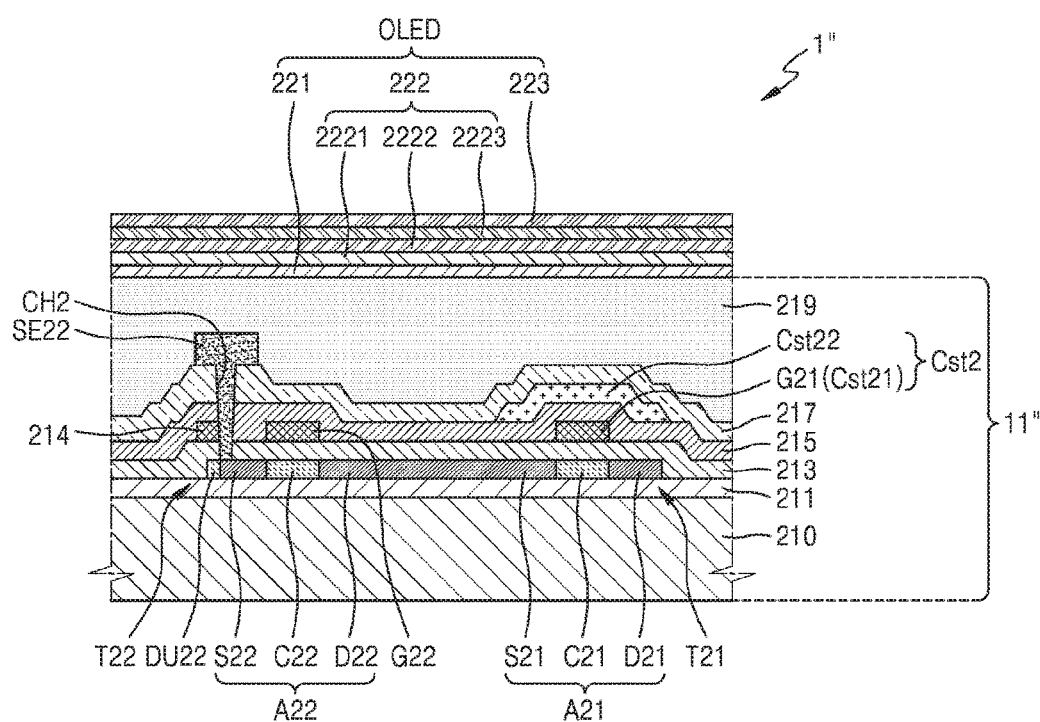
FIG. 3 is a schematic sectional view of an organic light-emitting display apparatus according to an alternative embodiment.

FIG. 3 is a schematic sectional view of an organic light-emitting display apparatus according to an alternative embodiment.

Referring to FIG. 3, an embodiment of an organic light-emitting display apparatus 1 includes a thin-film transistor array substrate 11" and an OLED on the thin-film transistor array substrate 11". The thin-film transistor array substrate 11" includes: a substrate 210; a switching active layer A22 of a switching transistor T22, which is on the substrate 210, and includes a switching source region S22, a switching channel region C22 and a switching drain region D22; a conductive layer SE22, which is on the switching active layer A22 and is electrically connected to the switching source region S22 or the switching drain region D22 via a contact hole CH2; a bottom gate insulating layer 213 and a top gate insulating layer 215, which are between the switching active layer A22 and the conductive layer SE22 and through which the contact hole CH2 is defined; and a first supporting layer 214, which is between the bottom gate insulating layer 213 and the top gate insulating layer 215 and surrounds at least a portion of the contact hole CH2.

Herein, the switching transistor T22 and the switching active layer A22 of FIG. 3 may be the same as the first transistor and the first active layer, respectively, but are not limited thereto.

The switching active layer A22 includes the switching source region S22, the switching drain region D22, the switching channel region C22, and a dummy active layer DU22 arranged close to the switching source region S22. Herein, the switching source region S22, the switching channel region C22 and the switching drain region D22 of FIG. 3 may be the same as the source region, the channel region and the drain region, respectively, but are not limited thereto.

In such an embodiment, the thin-film transistor array substrate 11" may further include a switching gate electrode G22 overlapping at least a portion of the switching active layer A22 and the first supporting layer 214 overlapping at least a portion of the dummy active layer DU22. In such an embodiment, the switching gate electrode G22 and the first supporting layer 214 may be disposed on the bottom gate insulating layer 213. Herein, the bottom gate insulating layer 213 of FIG. 3 may be the same as the first insulating layer.

The bottom gate insulating layer 213 may be disposed between the switching active layer A22 and the dummy active layer DU22, and the top gate insulating layer 215. The contact hole CH2 may be defined through the bottom gate insulating layer 213. Herein, the top gate insulating layer 215 of FIG. 3 may be the same as the second insulating layer.

The switching gate electrode G22 may be disposed between the bottom gate insulating layer 213 and the top gate insulating layer 215, and may overlap the switching channel region C22 in a plan view. Herein, the switching gate electrode G22 of FIG. 3 may be referred to as a first gate electrode.

The first supporting layer 214 may be disposed between the bottom gate insulating layer 213 and the top gate insulating layer 215, and surround at least a portion of the contact hole CH2. In an embodiment, the first supporting layer 214 may include a same material as the switching gate electrode G22.

An interlayer insulating layer 217 may be disposed on the top gate insulating layer 215.

In such an embodiment, the contact hole CH2 that exposes the switching source region S22 is defined or formed through the bottom gate insulating layer 213, the top gate insulating layer 215, and the interlayer insulating layer 217. According to an embodiment, when the bottom gate insulating layer 213, the top gate insulating layer 215 and the interlayer insulating layer 217 are etched to form the contact hole CH2, the first supporting layer 214 protects the lower portion of the top gate insulating layer 215, and thus the top gate insulating layer 215 may be effectively prevented from being damaged. Therefore, in such an embodiment, the finer contact hole CH2 may be effectively formed through the bottom gate insulating layer 213, the top gate insulating layer 215 and the interlayer insulating layer 217.

Figure 4:
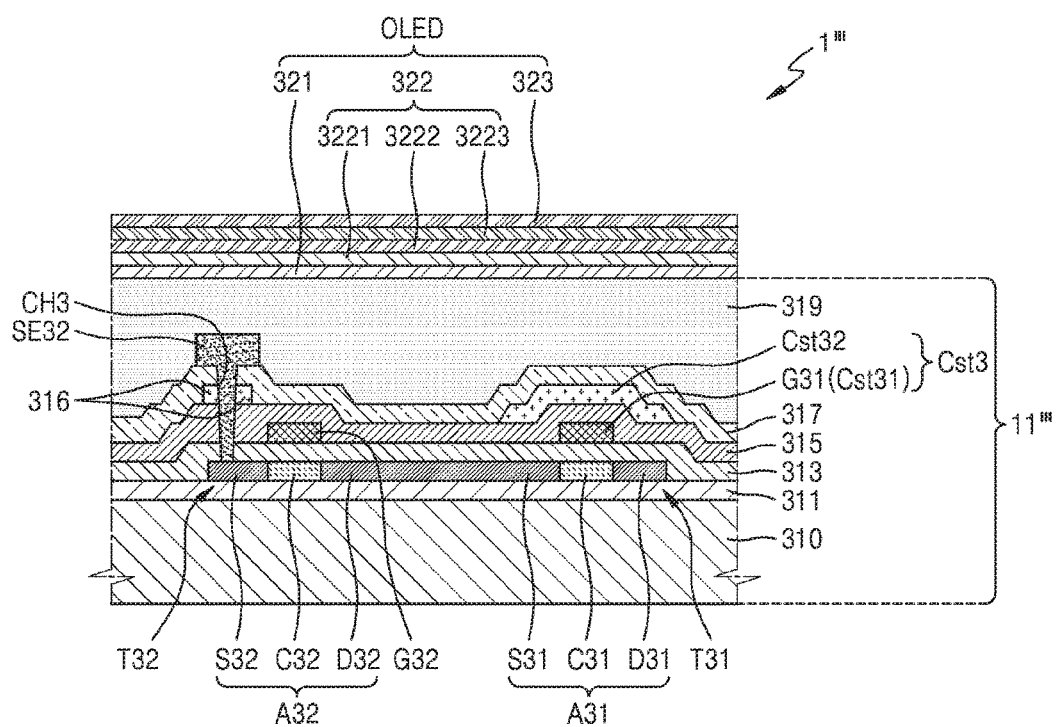
FIG. 4 is a schematic sectional view of an organic light-emitting display apparatus according to another alternative embodiment.

FIG. 4 is a schematic sectional view of an organic light-emitting display apparatus according to another alternative embodiment.

Referring to FIG. 4, an embodiment of an organic light-emitting display apparatus 1''' includes a thin-film transistor array substrate 11''' and an OLED on the thin-film transistor array substrate 11'''. The thin-film transistor array substrate 11''' includes: a substrate 310; a switching active layer A32 of a switching transistor T32, which is on the substrate 310 and includes a switching source region S32, a switching channel region C32 and a switching drain region D32; a conductive layer SE32, which is on the switching active layer A32 and is electrically connected to the switching source region S32 or the switching drain region D32 via a contact hole CH3; a top gate insulating layer 315 and an interlayer insulating layer 317, which are between the switching active layer A32 and the conductive layer SE32 and include the contact hole CH3; and a first supporting layer 316, which is between the top gate insulating layer 315 and the interlayer insulating layer 317 and surrounds at least a portion of the contact hole CH3.

Herein, the switching transistor T32, the switching active layer A32, the driving transistor T31 and a driving active layer A31 of FIG. 4 may be the same as the first transistor, the first active layer, the second transistor and the second active layer, respectively, but are not limited thereto.

In such an embodiment, the driving active layer A31 may include a driving source region S31, a driving drain region D31 and a driving channel region C31. In such an embodiment, the switching active layer A32 may include the switching source region S32, the switching drain region D32, and the switching channel region C32. Herein, the switching source region S32, the switching channel region C32, and the switching drain region D32 of FIG. 4 may be referred to as a source region, a channel region and a drain region, respectively, but are not limited thereto.

In such an embodiment, as shown in FIG. 4, a bottom gate insulating layer 313 that covers the driving active layer A31 and the switching active layer A32 is disposed on the buffer layer 311, and a driving gate electrode G31 overlapping at least a portion of the driving active layer A31 and a switching gate electrode G32 overlapping at least a portion of the switching active layer A32 may be disposed on the bottom gate insulating layer 313. Herein, the bottom gate insulating layer 313 and the driving gate electrode G31 of FIG. 4 may be referred to as a third insulating layer and a second gate electrode, respectively.

In such an embodiment, the contact hole CH3 is defined or formed through the bottom gate insulating layer 313.

The driving gate electrode G31 may define or function as a first electrode (e.g., a bottom electrode) Cst31 of a capacitor Cst3.

The switching gate electrode G32 is arranged between the bottom gate insulating layer 313 and the top gate insulating layer 315, and may overlap the switching channel region C32 in a plan view.

The top gate insulating layer 315 that covers the driving gate electrode G31 and the switching gate electrode G32 may be disposed on the bottom gate insulating layer 313. Herein, the top gate insulating layer 315 of FIG. 4 may be the same as the first insulating layer.

The first supporting layer 316 and a second electrode (e.g., a top electrode) Cst32 of the capacitor Cst3 may be disposed on the top gate insulating layer 315. In such an embodiment, the first supporting layer 316 and the second electrode Cst32 of the capacitor Cst3 may be disposed on a same layer, where the first supporting layer 316 may surround at least a portion of the contact hole CH3.

The capacitor Cst3 may be arranged to overlap the driving transistor T31 in a plan view. In such an embodiment, the capacitor Cst3 may include the driving gate electrode G31, which defines or functions as the first electrode Cst31 of the capacitor Cst3, and the second electrode Cst32 of the capacitor Cst3, which faces the driving gate electrode G31 across the top gate insulating layer 315.

The interlayer insulating layer 317 that covers the first supporting layer 316 and the second electrode Cst32 of the capacitor Cst3 may be disposed on the top gate insulating layer 315. Herein, the interlayer insulating layer 317 of FIG. 4 may be the same as the second insulating layer.

In such an embodiment, the contact hole CH3 that exposes the switching source region S32 may be defined or formed through the bottom gate insulating layer 313, the top gate insulating layer 315 and the interlayer insulating layer 317. According to an embodiment, when the bottom gate insulating layer 313, the top gate insulating layer 315, and the interlayer insulating layer 317 are etched to form the contact hole CH3, the first supporting layer 316 protects the lower portion of the interlayer insulating layer 317, and thus the interlayer insulating layer 317 may be effectively prevented from being damaged. Therefore, the finer contact hole CH3 may be effectively formed through the bottom gate insulating layer 313, the top gate insulating layer 315 and the interlayer insulating layer 317.

Figure 5:
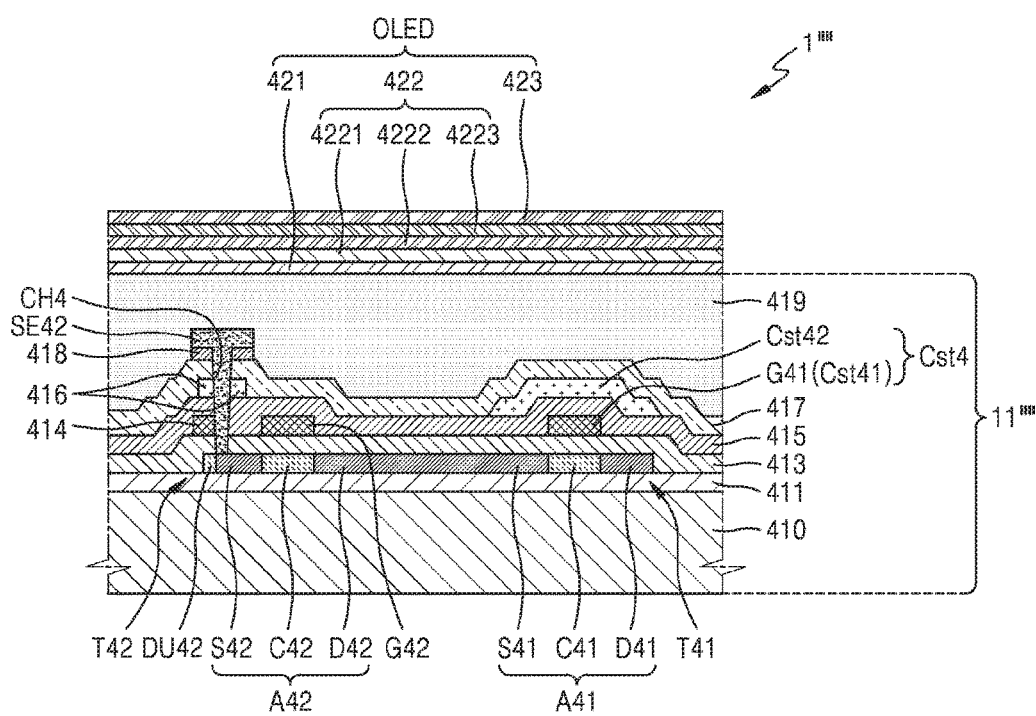
FIG. 5 is a schematic sectional view of an organic light-emitting display apparatus according to another alternative embodiment.

FIG. 5 is a schematic sectional view of an organic light-emitting display apparatus according to another alternative embodiment.

Referring to FIG. 5, an organic light-emitting display apparatus 1'' according to another embodiment includes a thin-film transistor array substrate 11'' and an OLED on the thin-film transistor array substrate 11''. The thin-film transistor array substrate 11'' includes: a substrate 410; a switching active layer A42 of a switching transistor T42, which is on the substrate 410 and includes a switching source region S42, a switching channel region C42 and a switching drain region D42; a conductive layer SE42, which is on the switching active layer A42 and is electrically connected to the switching source region S42 or the switching drain region D42 via a contact hole CH3; a top gate insulating layer 415 and an interlayer insulating layer 417, which are between the switching active layer A42 and the conductive layer SE42 and include the contact hole CH4; and a second supporting layer 416, which is between the top gate insulating layer 415 and the interlayer insulating layer 417 and surrounds at least a portion of the contact hole CH4.

Herein, the switching transistor T42, the switching active layer A42, the driving transistor T41 and a driving active layer A41 of FIG. 4 may be the same as the first transistor, the first active layer, the second transistor and the second active layer, respectively, but are not limited thereto.

Herein, the switching source region S42, the switching channel region C42 and the switching drain region D42 of FIG. 5 may the same as a source region, a channel region and a drain region, respectively, but are not limited thereto.

Herein, the bottom gate insulating layer 413, the driving gate electrode G41 and a first supporting layer 414 of FIG. 5 may be the same as the third insulating layer, the second gate electrode and the second supporting layer, respectively.

In such an embodiment, the top gate insulating layer 415 of FIG. 5 may be the same as the first insulation layer.

In such an embodiment, the second supporting layer 416 of FIG. 5 may be the same as the first supporting layer.

In such an embodiment, the interlayer insulating layer 417 of FIG. 5 may be the same as the second supporting layer.

In such an embodiment, the thin-film transistor array substrate 11'' may further include a mask pattern 418 and the conductive layer SE42 of the switching transistor T42, which are disposed on the interlayer insulating layer 417.

The mask pattern 418 may be disposed between the interlayer insulating layer 417 and the conductive layer SE42 and surround at least a portion of the contact hole CH4. The mask pattern 418 may include or be formed of a metal.

The conductive layer SE42 may be disposed on the mask pattern 418 to directly contact the mask pattern 418 and may be connected to the switching source region S42 via the contact hole CH4. An end portion of the conductive layer SE42 may be connected to an end portion of the mask pattern 418 without a step. However, the inventive concept is not limited thereto.

According to such an embodiment described above, the organic light-emitting display apparatus 1'' has improved display quality by effectively preventing a short-circuit between pixels due to an oxide layer even if a mask pattern, which is below a source electrode or a drain electrode, includes a metal and the oxide layer is formed therebetween.

Hereinafter, an embodiment of a method of manufacturing the organic light-emitting display apparatus will be described in detail with reference to FIGS. 6A through 6F.

FIGS. 6A through 6F are sectional diagrams showing an embodiment of a method of manufacturing the organic light-emitting display apparatus of FIG. 5.

Such an embodiment of the method may be used to manufacture not only components of the organic light-emitting display apparatus of FIG. 5, but also the same components of the organic light-emitting display apparatus shown in FIGS. 2 through 4.

Figure 6A:
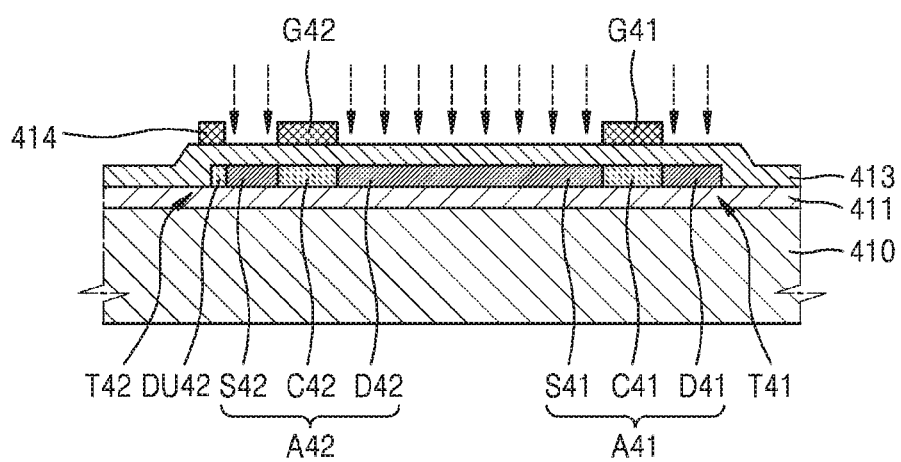
FIGS. 6A through 6F are sectional diagrams showing an embodiment of a method of manufacturing the organic light-emitting display apparatus of FIG. 5.

Referring to FIG. 6A, in such an embodiment, the switching active layer A42 of the switching transistor T42 including the switching source region S42, the switching channel region C42 and the switching drain region D42, is provided, e.g., formed, on the substrate 410.

In such an embodiment, to form the switching active layer A42, a buffer layer 411 may be provided or formed on the substrate 410 first, and then a driving semiconductor pattern (not shown) and a switching semiconductor pattern (not shown) may be provided or formed on the buffer layer 411. The driving semiconductor pattern (not shown) and the switching semiconductor pattern (not shown) may be connected to each other.

In such an embodiment, the bottom gate insulating layer 413 that covers the driving semiconductor pattern (not shown) and the switching semiconductor pattern (not shown) is provided or formed on the substrate 410. In such an embodiment, a metal layer is provided or formed on the bottom gate insulating layer 413, and the metal layer on the bottom gate insulating layer 413 is patterned. Therefore, the first supporting layer 414, the switching gate electrode G42 and the driving gate electrode G41 may be provided by the patterned metal layer on the bottom gate insulating layer 413.

In such an embodiment, the first supporting layer 414 may be provided or formed to overlap at least a portion of the switching semiconductor pattern (not shown) in an plan view. The switching gate electrode G42 may be provided or formed to overlap at least a portion of the switching semiconductor pattern (not shown) in a plan view and be apart from the first supporting layer 414, and the driving gate electrode G41 may be provided or formed to overlap at least a portion of the driving semiconductor pattern (not shown) in a plan view.

As described above, the driving gate electrode G41, the switching gate electrode G42 and the first supporting layer 414 may be formed using a same mask process. However, the inventive concept is not limited thereto.

In such an embodiment, the driving active layer A41, the switching active layer A42 and a dummy active layer DU42 may be formed by doping ion impurities to the driving semiconductor pattern (not shown) and the switching semiconductor pattern (not shown) by using the patterned metal layer that defines the driving gate electrode G41, the switching gate electrode G42 and the first supporting layer 414 as a mask. The dummy active layer DU42 is not doped with an impurity, may be formed of a same semiconductor material as the driving channel region C41 and the switching channel region C42, and may be provided at a region close to the switching source region S42.

Figure 6B:
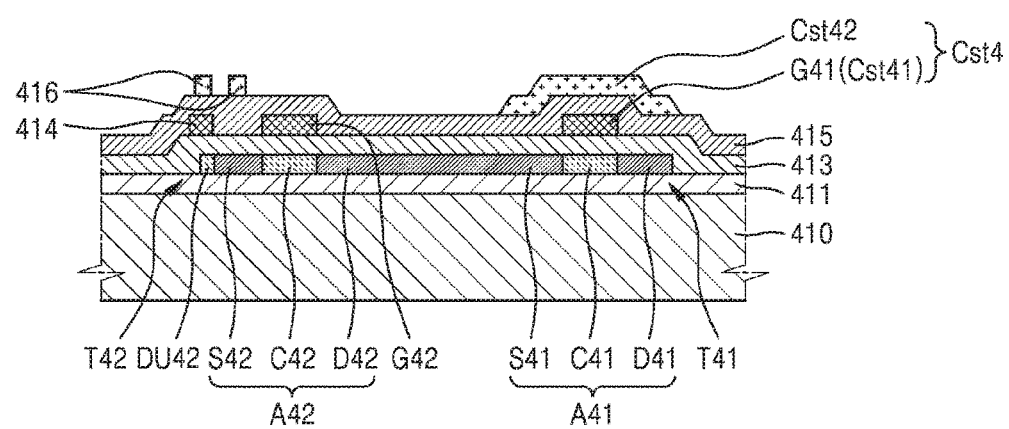

Referring to FIG. 6B, the top gate insulating layer 415 is provided or formed on the bottom gate insulating layer 413 to cover the driving gate electrode G41, the switching gate electrode G42 and the first supporting layer 414. In such an embodiment, a metal layer is formed on the top gate insulating layer 415, and the metal layer is patterned. Therefore, the second supporting layer 416 and a second electrode (e.g., a stop electrode) Cst42 of a capacitor Cst4 may be formed by the pattern metal layer on the top gate insulating layer 415.

In such an embodiment, the second supporting layer 416 may be provided or formed to overlap at least a portion of the first supporting layer 414 in a plan view, and the second electrode Cst42 of the capacitor Cst4 may be provided or formed to face the driving gate electrode G41. In an embodiment, as shown in FIG. 6B, the second supporting layer 416 may have a close loop-like shape surrounding the contact hole CH4, but the inventive concept is not limited thereto.

In an embodiment, as described above, the second supporting layer 416 and the second electrode Cst42 of the capacitor Cst4 may be formed using a same mask process. However, the inventive concept is not limited thereto.

Figure 6C:
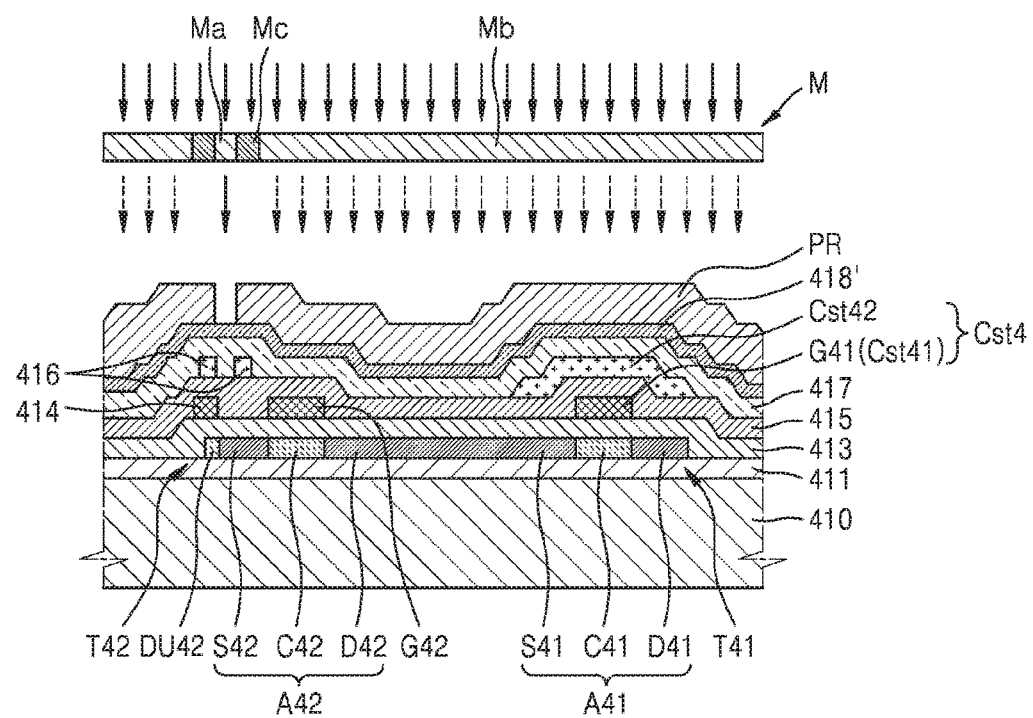

Referring to FIG. 6C, the interlayer insulating layer 417 is provided or formed on the top gate insulating layer 415 to cover the second supporting layer 416 and the second electrode Cst42 of the capacitor Cst4.

In such an embodiment, after a metal layer 418' is formed to cover the entire top surface of the interlayer insulating layer 417, a photoresist PR may be formed on the metal layer 418'.

After the photoresist PR is formed on the metal layer 418', light may be irradiated to the photoresist PR by using a half-tone mask M including a light-transmitting portion Ma that transmits light therethrough, a partial-transmitting portion Mb that partially transmits light therethrough, and a light-blocking portion Mc that blocks light. The photoresist PR may be a positive photoresist of which a light-irradiated region is dissolved in a developer. However, the inventive concept is not limited thereto.

Figure 6D:
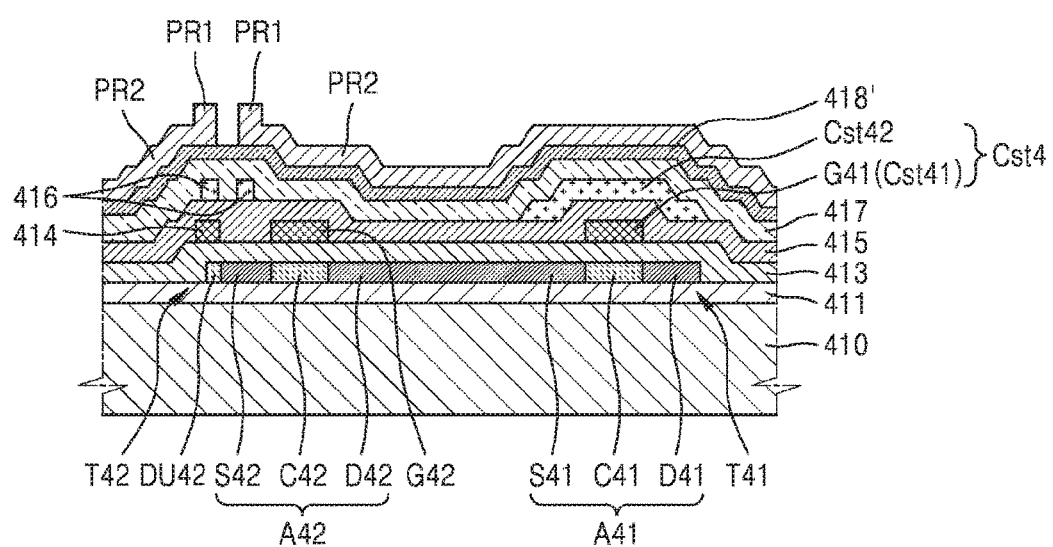

Referring to FIG. 6D, a photoresist pattern including a first region PR1 corresponding to the light-blocking portion Mc, a second region PR2, which corresponds to the partial-transmitting portion Mb and has a height lower than that of the first region PR1, and an opening corresponding to the light-transmitting portion Ma may be formed by irradiating light to the photoresist PR and removing a light-irradiated portion of the photoresist PR.

Figure 6E:
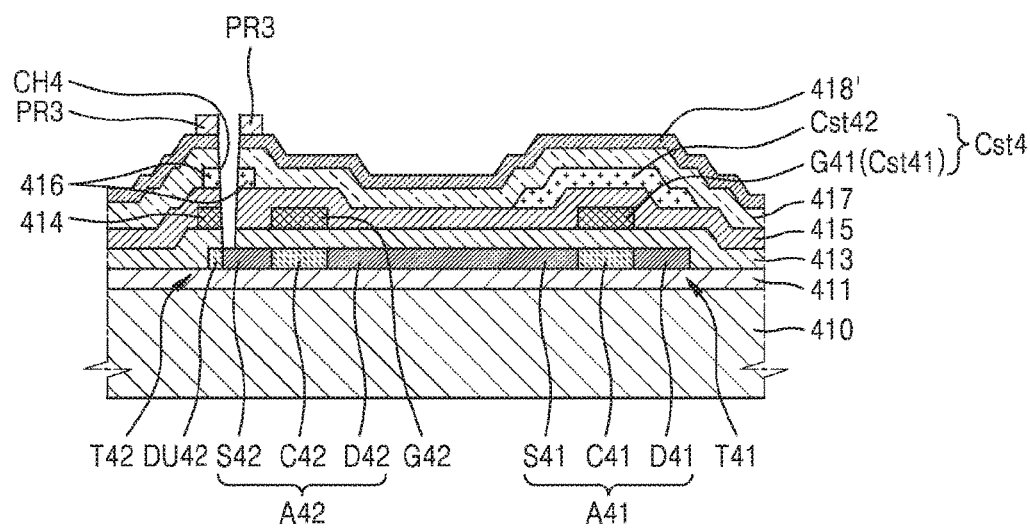

Referring to FIG. 6E, the interlayer insulating layer 417, the top gate insulating layer 415 and the bottom gate insulating layer 413 are etched to expose at least a portion of the switching source region S42, and thus the contact hole CH4 including at least portions contacting the first supporting layer 414 and the second supporting layer 416 may be formed through the interlayer insulating layer 417, the top gate insulating layer 415 and the bottom gate insulating layer 413.

In such an embodiment, the contact hole CH4 may be formed by removing the metal layer 418' exposed by the opening of the photoresist pattern and respective portions of the interlayer insulating layer 417, the top gate insulating layer 415, and the bottom gate insulating layer 413 arranged below the exposed portion of metal layer 418'.

In such an embodiment, when the interlayer insulating layer 417 is being etched, the second supporting layer 416 formed below the interlayer insulating layer 417 may effectively prevent the lower portion of the interlayer insulating layer 417 from being excessively etched. In such an embodiment, when the top gate insulating layer 415 is being etched, the first supporting layer 414 formed below the top gate insulating layer 415 may effectively prevent the lower portion of the top gate insulating layer 415 from being excessively etched. As described above, according to embodiments, when one or more insulating layers including a contact hole are being etched, the one or more insulating layers may not be excessively etched and uniformly etched, such that a fine contact hole may be more precisely formed.

In such an embodiment, a third photoresist PR3 may be formed by removing the entire portion of the photoresist pattern corresponding to the partial-transmitting portion Mb and a portion of the portion of the photoresist pattern corresponding to the light-blocking portion Mc by an ashing process.

Figure 6F:
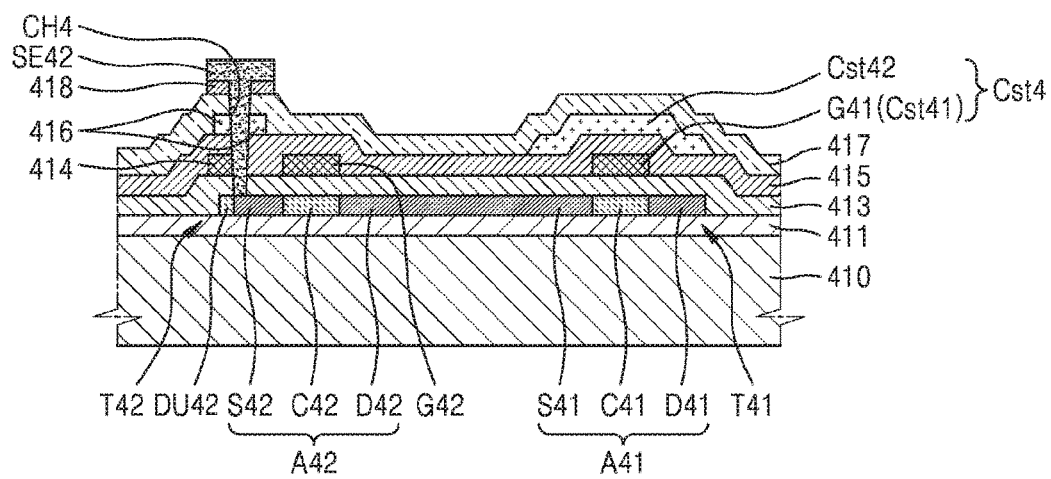

Referring to FIG. 6F, the mask pattern 418 may be formed by removing portions of the metal layer exposed by the partially-removed photoresist pattern. The mask pattern 418 may surround at least a portion of the contact hole CH4.

In such an embodiment, the conductive layer SE42 connected to the switching source region S42 via the contact hole CH4 is formed on the interlayer insulating layer 417.

In an embodiment, a conductive material covering the mask pattern 418 may be formed on the interlayer insulating layer 417 to form the conductive layer SE42. Here, the conductive material may be buried in the contact hole CH4 included in the bottom gate insulating layer 413, the top gate insulating layer 415, and the interlayer insulating layer 417. In such an embodiment, the conductive layer SE42 directly contacting the mask pattern 418 may be formed on the mask pattern 418 by patterning the conductive material arranged on the interlayer insulating layer 417.

According to an embodiment, as described above, by forming the mask pattern 418 and the conductive layer SE42 in different mask processes, a phenomenon that the mask pattern 418 is not etched due to an oxide layer formed on the mask pattern 418 may be prevented. Therefore, a short circuit between pixels may be effectively prevented, and thus the organic light-emitting display apparatus 1" with improved display quality may be manufactured.

Figure 7:
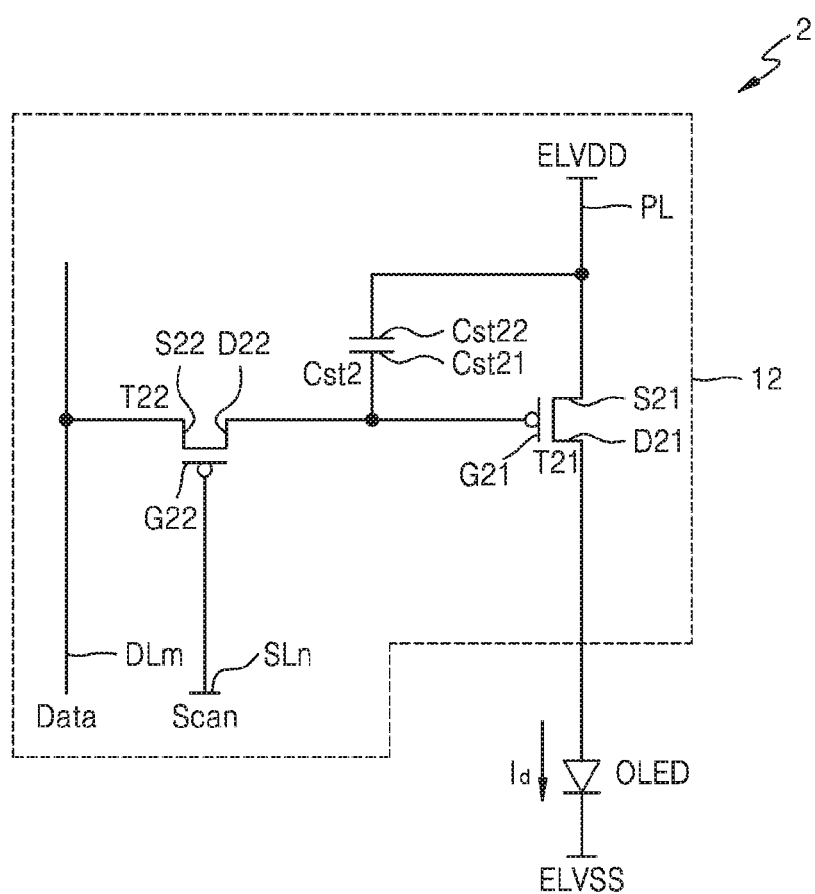
FIG. 7 is an equivalent circuit diagram showing an organic light-emitting display apparatus according to another alternative embodiment.

FIG. 7 is an equivalent circuit diagram showing an organic light-emitting display apparatus according to an alternative embodiment.

Referring to FIG. 7, an embodiment of an organic light-emitting display apparatus 2 includes a thin-film transistor array substrate 12 and an OLED on the thin-film transistor array substrate 12.

Wires included in the thin-film transistor array substrate 11 may include a scan line SLn for transmitting a scan signal Scan, a data line DLm for transmitting data signal Data, and a driving voltage line PL for transmitting a driving voltage ELVDD.

According to an embodiment, as shown in FIG. 7, a pixel circuit may include two transistors, e.g., a driving transistor T21 and a switching transistor T22, and one capacitor Cst2.

In such an embodiment, a driving gate electrode G21 of the driving transistor T21 is connected to a first electrode Cst21 of the capacitor Cst2, a driving source electrode S21 of the driving transistor T21 is connected to the driving voltage line PL, and a driving drain electrode D21 of the driving transistor T21 is electrically connected to a first electrode 521 (shown in FIG. 8) of the OLED. The driving transistor T21 receives data signal Data according to a switching operation of the switching transistor T22 and supplies a driving current $I_d$ to the OLED.

The switching gate electrode G22 of the switching transistor T22 is connected to the scan line SLn, the switching source region S22 of the switching transistor T22 is connected to the data line DLm, and the switching drain region D22 of the switching transistor T22 is connected to the driving gate electrode G21 of the driving transistor T21. The switching transistor T22 is turned on in response to a scan signal Scan received via the scan line SLn, and performs a switching operation for transmitting a data signal Data received via the data line DLm to the driving gate electrode G21 of the driving transistor T21.

A second electrode Cst22 of the capacitor Cst2 is connected to the driving voltage line PL, and the first electrode Cst21 of the capacitor Cst2 is connected to the driving gate electrode G21 of the driving transistor T21. The capacitor Cst2 charges data signals Data to be transmitted to the driving gate electrode G21 of the driving transistor T21, and retains the data signals Data even after the switching transistor T22 is turned off.

The first electrode 521 (shown in FIG. 8) of the OLED is connected to the driving drain electrode D21 of the driving transistor T21, and a second electrode 523 (shown in FIG. 8) of the OLED receives a common voltage ELVSS. Therefore, the OLED displays an image by receiving a driving current $I_d$ from the driving transistor T21 and emits light.

Figure 8:
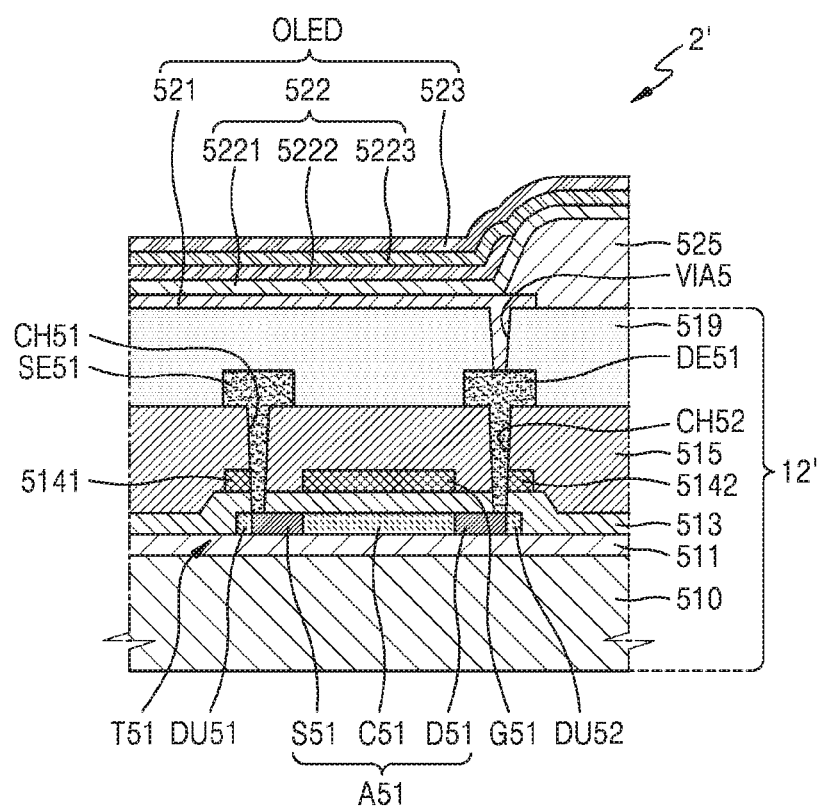
FIG. 8 is a schematic sectional view of an organic light-emitting display apparatus according to an alternative embodiment.

FIG. 8 is a schematic sectional view of an organic light-emitting display apparatus according to an embodiment.

Referring to FIG. 8, an embodiment of an organic light-emitting display apparatus 2' includes a thin-film transistor array substrate 12' and an OLED on the thin-film transistor array substrate 12'. In such an embodiment, the thin-film transistor array substrate 12' includes: a substrate 510; a driving active layer A51 of a driving transistor T51, which is on the substrate 510 and includes a driving source region S51, a driving channel region C51 and a driving drain region D51; a driving source electrode SE51, which is on the driving active layer A51 and is electrically connected to the driving source region S51 via a driving source contact hole CH51; a driving drain electrode DE51, which is on the driving active layer A51 and is electrically connected to the driving drain region D51 via a driving drain contact hole CH52; a bottom gate insulating layer 513 and a top gate insulating layer 515, which are disposed between the driving active layer A51, and the driving source electrode SE51 and the driving drain electrode DE51; a first supporting layer 5141, which is between the bottom gate insulating layer 513 and the top gate insulating layer 515 and surrounds at least a portion of the driving source contact hole CH51; and a second supporting layer 5142, which is between the bottom gate insulating layer 513 and the top gate insulating layer 515 and surrounds at least a portion of the driving drain contact hole CH52. In such an embodiment, the driving source contact hole CH51 and the driving drain contact hole CH52 are defined or formed through the bottom gate insulating layer 513 and the top gate insulating layer 515.

The thin-film transistor array substrate 12' may further include a buffer layer 511 disposed on the substrate 510. The driving transistor T51 including the driving active layer A51 is disposed on the buffer layer 511. In such an embodiment, the driving transistor T51 and the driving active layer A51 of FIG. 8 may be the same as the first transistor and the first active layer, but are not limited thereto.

The driving active layer A51 may include the driving source region S51 and the driving drain region D51, which are conductive by being doped with impurities and are apart from each other, and the driving channel region C51, which is between the driving source region S51 and the driving drain region D51 and includes a semiconductor material. In such an embodiment, the driving source region S51, the driving channel region C51 and the driving drain region D51 of FIG. 8 may be the same as the source region, the channel region and a drain region, respectively, but are not limited thereto.

The driving transistor T51 may further include a first dummy active layer DU51 and a second dummy active layer DU52. The first dummy active layer DU51 and the second dummy active layer DU52 may be close to the driving source region S51 and the driving drain region D51, respectively, and may include a same material as the driving channel region C51, that is, a semiconductor material.

The bottom gate insulating layer 513 that covers the driving active layer A51 is disposed on the buffer layer 511, and a driving gate electrode G51 overlapping at least a portion of the driving active layer A51, the first supporting layer 5141 overlapping at least a portion of the first dummy active layer DU51, and the second supporting layer 5142 overlapping at least a portion of the second dummy active layer DU52 may be disposed on the bottom gate insulating layer 513. In such an embodiment, the bottom gate insulating layer 513 of FIG. 8 may be the same as the first insulating layer, and the first supporting layer 5141 and the second supporting layer 5142 of FIG. 8 may be the same as the first supporting layer.

The bottom gate insulating layer 513 is arranged between the driving active layer A51, the first dummy active layer DU51 and the second dummy active layer DU52, and the top gate insulating layer 515. In such an embodiment, the driving source contact hole CH51 and the driving drain contact hole CH52 may be defined through the bottom gate insulating layer 513. Herein, the top gate insulating layer 515 of FIG. 8 may be the same as the second insulating layer.

The driving gate electrode G51 is arranged between the bottom gate insulating layer 513 and the top gate insulating layer 515, and may overlap the driving channel region C51 in a plan view. In such an embodiment, the driving gate electrode G51 of FIG. 8 may be the same as the first gate electrode.

The first supporting layer 5141 is arranged between the bottom gate insulating layer 513 and the top gate insulating layer 515, and may surround at least a portion of the driving source contact hole CH51.

The second supporting layer 5142 is arranged between the bottom gate insulating layer 513 and the top gate insulating layer 515, and may surround at least a portion of the driving drain contact hole CH52.

The driving gate electrode G51, the first supporting layer 5141 and the second supporting layer 5142 may include a same material as each other.

The top gate insulating layer 515 that covers the driving gate electrode G51, the first supporting layer 5141 and the second supporting layer 5142 may be disposed on the bottom gate insulating layer 513.

In such an embodiment, the driving source contact hole CH51 and the driving drain contact hole CH52 that respectively expose the driving source region S51 and the driving drain region D51 are defined through the bottom gate insulating layer 513 and the top gate insulating layer 515. According to an embodiment, when the bottom gate insulating layer 513 and the top gate insulating layer 515 are being etched to form the driving source contact hole CH51 and the driving drain contact hole CH52, the first supporting layer 5141 and the second supporting layer 5142 protect the lower portion of the top gate insulating layer 515, thereby preventing the top gate insulating layer 515 from being damaged. Therefore, a fine contact holes may be formed more precisely through the bottom gate insulating layer 513 and the top gate insulating layer 515.

The driving source electrode SE51 and the driving drain electrode DE51 of the driving transistor T51 may be disposed on the top gate insulating layer 515. The driving source electrode SE51 may be connected to the driving source region S51 via the driving source contact hole CH51, and the driving drain electrode DE51 may be connected to the driving drain region D51 via the driving drain contact hole CH52.

A via insulating layer 519 that covers the driving source electrode SE51 and the driving drain electrode DE51 may be disposed on the top gate insulating layer 515. According to an embodiment, the via insulating layer 519 may include or be formed of an organic material, such as an acrylic organic material, polyimide, or BCB. The via insulating layer 519 may protect elements (e.g., thin-film transistors) of a pixel circuit disposed therebelow and may planarize the top surface of the substrate 510.

In such an embodiment, a via hole VIA5 that exposes the driving drain electrode DE51 of the driving transistor T51 may be defined in the via insulating layer 519. The driving drain electrode DE51 of the driving transistor T51 may be disposed in the driving drain contact hole CH52 defined in the top gate insulating layer 515. The driving drain electrode DE51 and the first electrode 521 of the OLED may be electrically connected to each other via the via hole VIA5. In such an embodiment, the first electrode 521 may be electrically connected to the driving transistor T51 via the driving drain contact hole CH52 and the via hole VIA5.

The first electrode 521 of the OLED may be disposed on the via insulating layer 519. According to an embodiment, the organic light-emitting display apparatus 2' may be a top-emission type organic light-emitting display apparatus in which an image is displayed in the up direction from the substrate 510. In such an embodiment, the first electrode 521 may include a metal reflective layer including silver (Ag), magnesium (Mg), aluminum (Al), platinum (Pt), palladium (Pd), gold (Au), nickel (Ni), neodymium (Nd), iridium (Ir) or chromium (Cr). In such an embodiment, the first electrode 521 may include a transparent conductive layer including ITO, IZO, ZnO or indium tin zinc oxide ("ITZO"). According to an alternative embodiment, the organic light-emitting display apparatus 2' may be a bottom-emission type organic light-emitting display apparatus in which an image is displayed in the down direction from the substrate 510. In such an embodiment, the first electrode 521 may include a transparent conductive layer including ITO, IZO, ZnO or ITZO, and may further include a semi-transparent metal layer.

A pixel defining layer 525 that defines respective pixels may be disposed on the via insulating layer 519. The pixel defining layer 525 includes an opening that exposes the top surface of the first electrode 521, and may cover edge portions of the first electrode 521.

An intermediate layer 522 including an organic emission layer 5222 may be disposed on the portion of the first electrode 521 exposed by the pixel defining layer 525. The organic emission layer 5222 may emit a red light, a green light, a blue light, or a white light. The intermediate layer 522 may include the organic emission layer 5222, a bottom common layer 5221 disposed between the first electrode 521 and the organic emission layer 5222 and a top common layer 5223 disposed between the organic emission layer 5222 and the second electrode 523.

The bottom common layer 5221 may include a hole injection layer ("HIL") and/or a hole transport layer ("HTL"), and the top common layer 5223 may include an electron transport layer ("ETL") and/or an electron injection layer ("EIL"). According to an embodiment, various function layers other than the layers described above may be disposed between the first electrode 521 and the second electrode 523.

The second electrode 523 may be disposed on the intermediate layer 522. In an embodiment, where the organic light-emitting display apparatus 2' is a top-emission type organic light-emitting display apparatus, the second electrode 523 may include a transparent or semi-transparent electrode. In an alternative embodiment, where the organic light-emitting display apparatus 2' is a bottom-emission type organic light-emitting display apparatus, the second electrode 523 may include a reflective electrode.

In an embodiment, the organic light-emitting display apparatus 2' may further include an encapsulating substrate (not shown) or an encapsulating layer (not shown), which is disposed on the second electrode 523.

According to an embodiment, the organic light-emitting display apparatus 2' may be highly integrated due to fine contact holes and may exhibit improved display quality based on a reduced risk of short-circuit due to arrangement of less-damaged insulating layers.

Hereinafter, another alternative embodiment of the organic light-emitting display apparatus will be described.

Figure 9:
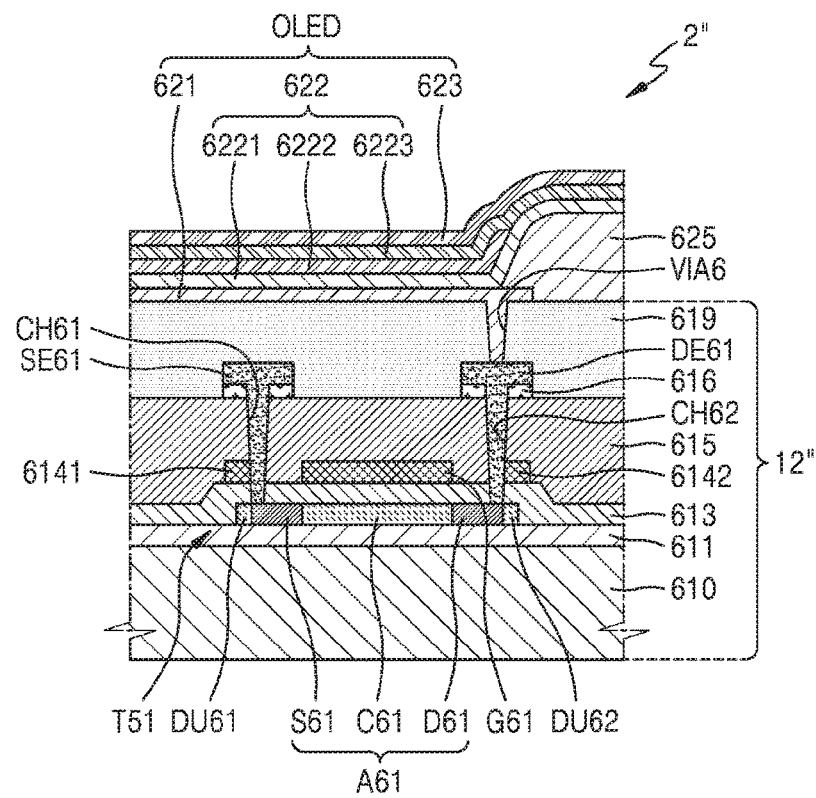
FIG. 9 is a schematic sectional view of an organic light-emitting display apparatus according to another alternative embodiment.

FIG. 9 is a schematic sectional view of an organic light-emitting display apparatus according to another embodiment.

The organic light-emitting display apparatus shown in FIG. 9 is substantially the same as the organic light-emitting display apparatus shown in FIG. 8, and any repetitive detailed description of the same or like elements shown in FIG. 9 will hereinafter be omitted or simplified.

Referring to FIG. 9, an embodiment of an organic light-emitting display apparatus 2" includes a thin-film transistor array substrate 12" and an OLED on the thin-film transistor array substrate 12". In such an embodiment, the thin-film transistor array substrate 12" includes: a substrate 610; a driving active layer A61 of a driving transistor T61, which is on the substrate 610 and includes a driving source region S61, a driving channel region C61 and a driving drain region D61; a driving source electrode SE61, which is on the driving active layer A61 and is electrically connected to the driving source region S61 via a driving source contact hole CH61; a driving drain electrode DE61, which is on the driving active layer A61 and is electrically connected to the driving drain region D61 via a driving drain contact hole CH62; a bottom gate insulating layer 613 and a top gate insulating layer 615, which are disposed between the driving active layer A61 and the driving source electrode SE61 and the driving drain electrode DE61 and include the driving source contact hole CH61 and the driving drain contact hole CH62; a first supporting layer 6141, which is between the bottom gate insulating layer 613 and the top gate insulating layer 615 and surrounds at least a portion of the driving source contact hole CH61; and a second supporting layer 6142, which is between the bottom gate insulating layer 613 and the top gate insulating layer 615 and surrounds at least a portion of the driving drain contact hole CH62.

In such an embodiment, a mask pattern 616, the driving source electrode SE61 of the driving transistor T61, and the driving drain electrode DE61 of the driving transistor T61 may be disposed on the top gate insulating layer 615.

In such an embodiment, the mask pattern 616 may be disposed between the top gate insulating layer 615 and the driving source electrode SE61 and surround at least a portion of the driving source contact hole CH61. In such an embodiment, the mask pattern 616 may be disposed between the top gate insulating layer 615 and the driving drain electrode DE61 and surround at least a portion of the driving drain contact hole CH62. In such an embodiment, the mask pattern 616 may include or be formed of a metal.

The driving source electrode SE61 and the driving drain electrode DE61 may be disposed on the mask pattern 616 to directly contact the mask pattern 616. End portions of the driving source electrode SE61 and the driving drain electrode DE61 may be connected to end portions of the mask pattern 616 without a step. However, the inventive concept is not limited thereto.

According to an embodiment, the organic light-emitting display apparatus 2" has improved display quality by effectively preventing a short-circuit between pixels due to an oxide layer even when a mask pattern below a source electrode or a drain electrode includes a metal and the oxide layer is formed therebetween.

According to embodiments of the inventive concept, a thin-film transistor array substrate, which may be highly integrated and exhibits improved display quality due to fine contact holes formed without damaging insulating layers, a method of manufacturing the thin-film transistor array substrate, and an organic light-emitting display apparatus including the thin-film transistor array substrate may be provided.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A thin-film transistor array substrate comprising:
   a substrate;
   a first active layer of a first transistor, which is on the substrate, wherein the first active layer comprises a source region, a channel region and a drain region;
   a conductive layer, which is on the first active layer and is electrically connected to the source region or the drain region via a contact hole;
   a first insulating layer and a second insulating layer, which are between the first active layer and the conductive layer, wherein the contact hole is defined through the first and second insulating layers; and
   a first supporting layer, which is between the first insulating layer and the second insulating layer, surrounds at least a portion of the contact hole, and directly contacts the conductive layer.

2. The thin-film transistor array substrate of claim 1, wherein the first supporting layer comprises a metal.

3. The thin-film transistor array substrate of claim 1, further comprising:
   a first gate electrode of the first transistor, which is between the first insulating layer and the second insulating layer and overlaps the channel region of the first active layer in a plan view,
   wherein the first supporting layer comprises a same material as the first gate electrode.

4. The thin-film transistor array substrate of claim 1, further comprising:
   a third insulating layer, which is between the first active layer and the first insulating layer, wherein the contact hole is defined through the third insulating layer;
   a second transistor, which is electrically connected to the first transistor; and
   a capacitor, which overlaps the second transistor in a plan view,
   wherein the second transistor comprises:
     a second active layer in a same layer as the first active layer; and
     a second gate electrode on the third insulating layer to overlap at least a portion of the second active layer, and
   wherein the capacitor comprises:
     a first electrode defined by the second gate electrode; and
     a second electrode which faces the second gate electrode.

5. The thin-film transistor array substrate of claim 4, wherein the first supporting layer is in the same layer as the second electrode and comprises a same material as the second electrode.

6. The thin-film transistor array substrate of claim 4, further comprising:
   a second supporting layer, which is between the third insulating layer and the first insulating layer and surrounds at least a portion of the contact hole.

7. The thin-film transistor array substrate of claim 1, further comprising:
   a mask pattern, which is between the second insulating layer and the conductive layer and surrounds at least a portion of the contact hole,
   wherein the mask pattern directly contacts the conductive layer.

8. The thin-film transistor array substrate of claim 7, wherein the mask pattern comprises a metal.

9. A method of manufacturing a thin-film transistor array substrate, the method comprising:
   providing a first active layer of a first transistor, which comprises a source region, a channel region and a drain region, on a substrate;
   providing a first insulating layer, which covers the first active layer, on the substrate;
   providing a first supporting layer, which overlaps at least a portion of the first active layer in a plan view and comprises a metal, on the first insulating layer;

providing a second insulating layer on the first insulating layer to cover the first supporting layer;

forming a contact hole, which at least partially contacts the first supporting layer, by etching the first insulating layer and the second insulating layer to expose at least a portion of the source region or the drain region; and forming a conductive layer, which is connected to the source region or the drain region via the contact hole, on the second insulating layer wherein the first supporting layer directly contacts the conductive layer.

10. The method of claim 9, further comprising:

after the providing the first insulating layer, providing a first gate electrode, which overlaps the channel region in a plan view and is spaced apart from the first supporting layer, on the first insulating layer, wherein the providing the first gate electrode and the providing the supporting layer are performed during a same mask process.

11. The method of claim 9, further comprising:

providing a second transistor electrically connected to the first transistor and a capacitor overlapping the second transistor in a plan view, wherein the providing the second transistor and the capacitor comprises:

before the providing the first insulating layer, providing a second active layer of the second transistor in the same layer as the first active layer;

providing a third insulating layer on the substrate to cover the first active layer and the second active layer;

providing a second gate electrode, which overlaps at least a portion of the second active layer, on the third insulating layer; and, after the providing the first insulating layer, providing a second electrode of the capacitor to face the second gate electrode, which functions as a first electrode of the capacitor, on the first insulating layer.

12. The method of claim 11, wherein the providing the second electrode and the providing the first supporting layer are performed during a same mask process.

13. The method of claim 9, further comprising:

before the providing the conductive layer, providing a mask pattern, which contacts the conductive layer, on the second insulating layer, wherein the providing the mask pattern comprises:

providing a metal layer to cover an entire top surface of the second insulating layer;

providing a photoresist on the metal layer;

irradiating light onto the photoresist by using a half-tone mask comprising a light-transmitting portion which transmits the light therethrough, a partial-transmitting portion which partially transmits the light therethrough, and a light-blocking portion which blocks the light;

providing a photoresist pattern by removing a light-irradiated portion of the photoresist, wherein the photoresist pattern comprises a first region corresponding to the light-blocking portion, a second region, which corresponds to the partial-transmitting portion and has a height lower than a height of the first region, and an opening corresponding to the light-transmitting portion;

forming the contact hole by removing portions of the metal layer exposed by the opening of the photoresist pattern and portions of the first insulating layer and the second insulating layer corresponding to the portions of the metal layer exposed by the opening of the photoresist pattern;

removing an entire portion of the photoresist pattern corresponding to the partial-transmitting portion and a portion of the photoresist pattern corresponding to the light-blocking portion by an ashing process; and forming the mask pattern by removing portions of the metal layer exposed by the partially-removed photoresist pattern.

14. An organic light-emitting display apparatus comprising:

a substrate;

a first active layer of a first transistor, which is on the substrate, wherein the first active layer comprises a source region, a channel region and a drain region;

a conductive layer, which is on the first active layer and is electrically connected to the source region or the drain region via a contact hole;

a first insulating layer and a second insulating layer, which are between the first active layer and the conductive layer, wherein the contact hole is defined through the first and second insulating layers;

a first supporting layer, which is between the first insulating layer and the second insulating layer, surrounds at least a portion of the contact hole and directly contacts the conductive layer;

a via insulating layer, which covers the first transistor;

a first electrode, which is on the via insulating layer;

a second electrode, which faces the first electrode; and an organic emission layer, which is between the first electrode and the second electrode.

15. The organic light-emitting display apparatus of claim 14, wherein the first supporting layer comprises a metal.

16. The organic light-emitting display apparatus of claim 14, further comprising:

a first gate electrode of the first transistor, which is between the first insulating layer and the second insulating layer and overlaps the channel region in a plan view, wherein the first supporting layer comprises a same material as the first gate electrode.

17. The organic light-emitting display apparatus of claim 14, further comprising:

a third insulating layer, which is between the first active layer and the first insulating layer and comprises the contact hole;

a second transistor, which is electrically connected to the first transistor; and a capacitor, which overlaps the second transistor in a plan view, wherein the second transistor comprises:

a second active layer in a same layer as the first active layer; and a second gate electrode on the third insulating layer to overlap at least a portion of the second active layer, and wherein the capacitor comprises:

a first electrode defined by the second gate electrode; and a second electrode which faces the second gate electrode.

18. The organic light-emitting display apparatus of claim 17, wherein the first supporting layer is in a same layer as the second electrode and comprises a same material as the second electrode.

19. The organic light-emitting display apparatus of claim 17, further comprising:
a second supporting layer, which is between the third insulating layer and the first insulating layer and surrounds at least a portion of the contact hole.

20. The organic light-emitting display apparatus of claim 14, further comprising:
a mask pattern, which is between the second insulating layer and the conductive layer and surrounds at least a portion of the contact hole,
wherein the mask pattern directly contacts the conductive layer and comprises a metal.

\* \* \* \* \*